United States Patent
Goo et al.

(10) Patent No.: US 7,192,891 B2
(45) Date of Patent: Mar. 20, 2007

(54) METHOD FOR FORMING A SILICON OXIDE LAYER USING SPIN-ON GLASS

(75) Inventors: Ju-Seon Goo, Kyunggi-Do (KR);
Eun-Kee Hong, Kyunggi-do (KR);
Hong-Gun Kim, Kyunggi-Do (KR);
Kyu-Tae Na, Seoul (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 251 days.

(21) Appl. No.: 10/631,848

(22) Filed: Aug. 1, 2003

(65) Prior Publication Data
US 2005/0026443 A1 Feb. 3, 2005

(51) Int. Cl.
*H01L 21/31* (2006.01)
*H01L 21/461* (2006.01)

(52) U.S. Cl. .............. 438/782; 438/781; 257/E21.494
(58) Field of Classification Search ........... 438/781, 438/782; 257/E21.479, E21.482, E21.494
See application file for complete search history.

(56) References Cited

U.S. PATENT DOCUMENTS

| | | | |
|---|---|---|---|
| 4,937,304 A | 6/1990 | Ayama et al. ............ 528/34 |
| 4,950,381 A | 8/1990 | Takeuchi et al. ........... 528/10 |
| 5,310,720 A | 5/1994 | Shin et al. ............... 438/760 |
| 5,436,398 A | 7/1995 | Shimizu et al. ........... 525/475 |
| 5,494,978 A | 2/1996 | Shimizu et al. ........... 525/474 |
| 5,614,271 A * | 3/1997 | Shibuya et al. ........... 427/541 |
| 5,905,130 A | 5/1999 | Nakahara et al. .......... 528/14 |
| 5,907,382 A * | 5/1999 | Kajiura et al. ............ 349/158 |
| 5,922,411 A * | 7/1999 | Shimizu et al. ........... 427/397.7 |
| 5,976,618 A | 11/1999 | Fukuyama et al. ......... 427/226 |
| 6,083,860 A * | 7/2000 | Matsuo et al. ............. 501/92 |
| 6,479,405 B2 | 11/2002 | Lee et al. ................. 438/782 |

FOREIGN PATENT DOCUMENTS

| JP | 11145286 | 5/1999 |
|---|---|---|
| KR | 2002-0045783 | 6/2002 |

* cited by examiner

*Primary Examiner*—Caridad Everhart
(74) *Attorney, Agent, or Firm*—Harness, Dickey & Pierce

(57) ABSTRACT

A method is provided for forming silicon oxide layers during the processing of semiconductor devices by applying a SOG layer including polysilazane to a substrate and then substantially converting the SOG layer to a silicon oxide layer using an oxidant solution. The oxidant solution may include one or more oxidants including, for example, ozone, peroxides, permanganates, hypochlorites, chlorites, chlorates, perchlorates, hypobromites, bromites, bromates, hypoiodites, iodites, iodates and strong acids.

47 Claims, 13 Drawing Sheets

METHOD FOR FORMING A SILICON OXIDE LAYER USING SPIN-ON GLASS

BACKGROUND OF THE INVENTION

1. Field of the Invention

The present invention relates generally to a method for curing a spin-on glass (SOG) composition including polysilazane to form silicon oxide and, more particularly, to a method for curing a SOG layer with an oxidant solution to form a silicon oxide layer during the manufacture of the semiconductor device.

2. Description of the Related Art

The design and manufacture of semiconductor devices continues to improve and produce semiconductor devices having higher operating speeds and larger storage capacities. In order to expand upon the current generation of semiconductor devices, efforts are continuing to develop improved designs and processes for increasing density, improving reliability, reducing cost and/or reducing response time.

Integrated circuits are typically manufactured by forming large numbers of transistors, capacitors and other circuit elements on a single substrate. The various transistors and other elements are then electrically interconnected using one or more patterns of conductive material, typically a metal, to achieve the desired circuit function(s). Metal oxide semiconductor (MOS) and bipolar VLSI and ULSI devices, for example, tend to include multilevel interconnection structures by which millions of individual transistors are interconnected to produce, for example, DRAM and SRAM devices. During the process of forming such multilevel interconnection structures, the surface of the top layer tends to become increasingly irregular and uneven as the circuit elements and interconnection patterns are formed.

For example, a semiconductor wafer having metal interconnection layers is typically manufactured by forming the underlying circuit elements and then depositing a first insulating layer over the circuit elements. Contact holes are then opened in certain regions of the first insulating layer to permit electrical contact to be made to certain regions of the circuit elements. A first metal layer is deposited, patterned and etched to form a first metal pattern. Because the circuit elements tend to present an uneven surface topography, the surface of the first insulating layer formed over those elements will also tend to be uneven. If the first metal layer is formed directly on an uneven first insulation layer, however, the metal layer may tend to exhibit various defects such as thinning or fractures as a result of protrusions and openings present in the underlying insulation layer.

Similarly, when one or more additional conductive patterns are utilized, one or more insulating layers will be formed over the underlying conductive pattern and will tend to exhibit, at least initially, surface roughness reflecting the underlying conductive pattern. If a second metal layer is formed directly on an uneven insulating layer, the second metal layer may also tend to exhibit various defects such as thinning or fractures as a result of the varied topography of the underlying insulation layer.

Because defects in any of the metal patterns will tend to depress both the yield and the reliability of the resulting semiconductor devices, conventional semiconductor processes tend to include planarization steps to produce a relatively planar surface on the insulting layer before forming the contact or via openings or depositing the conductive layers. When more than one metal interconnection layer is used, the insulating layers formed between successive metal layers may be planarized and thereby improve the uniformity of the metal layer and reduce defects in the resulting metal pattern.

A variety of materials may be utilized as the insulating layer, including, for example, HDP (high-density plasma) CVD oxide layers, $O_3$-TEOS (ozone-tetraethylorthosilicate), for filling the trench openings in shallow trench isolation (STI) processes or as an insulating interlayer material arranged between conductive layers. However, these types of oxide layers tend to exhibit poor gap-filling characteristics, e.g., a layer having bridges, gaps and voids, when the structures being coated have feature sizes consistent with design rules such as those for 0.13 µm and sub-0.10 µm devices.

Various methods have been developed for providing a planarized insulation layer including reflow processes utilizing a borophosphosilicate glass (BPSG) layer, coating processes utilizing a SOG layer and chemical mechanical polishing (CMP) processes for removing material from the wafer surface.

Although BPSG has been utilized as an insulation layer material for filling gaps between the lines in conducting wire, the nature of the deposited BPSG film may depend primarily on highly equipment-specific deposition parameters. In addition, gases used in the BPSG deposition process are expensive and severely toxic and, once deposited, the BPSG layer requires a high-temperature reflow process to achieve a more planarized surface. Further, compared with other oxides, BPSG tends to exhibit a higher etch rate in wet etchants, such as HF or BHF solutions, thereby complicating control of the etch process.

As the device packing density increases and the design rule sizing decreases for memory devices having capacities on the order of 256 megabits or more, BPSG insulation layers may tend to exhibit increased numbers of defects, such as voids and bridges, that tend to reduce device yield and reliability. Further, although an etch stop layer may be used to address etch selectivity issues, the formation of the BPSG layer may damage the etch stop layer and the additional layer results in increased process complexity. As a result, conventional BPSG processes typically utilize a thermal reflow process and/or a CMP process to produce a sufficiently planar surface.

An alternative to the BPSG processes are those processes that form an insulation layer by spin-coating a SOG composition to form a generally planar SOG layer on the underlying structures. For example, U.S. Pat. No. 5,310,720 (issued to Shin et al.) discloses a method in which a polysilazane layer is formed using a SOG composition and then heated in an oxygen atmosphere to form a silicon oxide layer. U.S. Pat. No. 6,479,405 (issued to Lee et al.) discloses a method of forming a silicon oxide layer through heat treatment of a SOG layer including PHPS. U.S. Pat. No. 5,976,618 (issued to Fukuyama et al.) discloses a method in which an inorganic SOG layer is formed and then subjected to a two-step heat treatment process to convert the SOG layer into a silicon oxide layer. Korean Patent Laid-Open Publication No. 2002-45783 discloses a method of forming a SOG layer on a substrate, pre-baking the SOG layer at 50° C. to 350° C. to remove solvent from the SOG layer, hard-baking the SOG layer at 350° C. to 500° C. to reduce the generation of particles, and then annealing the SOG layer at 600° C. to 1200° C. to form an oxide layer. The disclosures of each of the documents referenced above are incorporated by reference herein in their entirety.

U.S. Pat. No. 5,494,978 (issued to Shinizu et al.) discloses a method of preparing a defoamed polysilazane utilizing inorganic polysilazane having an average molecular weight of 100–100,000. U.S. Pat. No. 5,905,130 (issued to Nakahara et al.) discloses a methods of preparing polysilazane by i) reacting a polyaminosilane compound with a polyhydrogenated nitrogen-containing compound in the presence of a base catalyst or by ii) reacting a polyhydrogenated silicon compound with a polyhydrogenated nitrogen-containing compound under a basic solid oxide catalyst. U.S. Pat. No. 5,436,398 (issued to Shimizu et al.) discloses a method of preparing PHPS having an average molecular weight of about 1,120. U.S. Pat. No. 4,937,304 (issued to Ayama et al.) and U.S. Pat. No. 4,950,381 (issued to Takeuchi et al.) discloses methods for preparing polysilazanes having a range of molecular weights. The disclosures of each of the documents referenced above are incorporated by reference herein in their entirety.

The basic backbone structure of polysilazane-based SOG materials includes Si—N, Si—H and N—H bonds. When such materials are heated to a sufficient temperature under the proper atmosphere, typically including oxygen and water vapor, a majority of the Si—N bonds will be converted into (or substituted with) Si—O bonds. Thus a relatively simple spin coating process followed by a relatively simple thermal curing process may be utilized to form a SOG layer and then to convert the SOG layer into a silicon oxide layer in a relatively simple and economical manner.

Not all of the Si—N bonds, however, are converted to Si—O bonds (see, for example, Japanese Patent Laid-Open No. Hei 11-145286) during such a curing process. In order to convert substantially all of the remaining Si—N bonds to Si—O bonds, the cured SOG layer is typically then treated (or annealed) at a higher temperature (about 600° C. to 1200° C.) under an oxidizing atmosphere. When the SOG layer is treated at a temperature of about 300° C. to 600° C. the conversion of polysilazane in the SOG layer to silicon oxide ($SiO_2$) tends to be incomplete, producing a layer with a less stable structure of $SiH_xN_yO_z$ (wherein x, y, z are positive numbers). Layers having this less stable structure will tend to continue to react with atmospheric oxygen and water vapor over time to convert the $SiH_xN_yO_z$ more completely to a $SiO_2$ layer.

FIG. 1 is a Fourier Transform Infrared Spectroscopy (FTIR) graph illustrating the absorbance characteristics of a SOG layer both immediately after hard-baking and after the hard-baked SOG layer was maintained for an additional seven days under ambient conditions. The SOG layer was formed by depositing a SOG composition on a substrate to a thickness of about 3,400 Å. This deposited SOG layer was then hard-baked at a temperature of about 400° C. for period of between about 10 minutes and about 60 minutes under an oxygen atmosphere and the absorbance characteristics of the resulting layer were evaluated using FTIR. The substrate with the hard-baked SOG layer was then maintained under ambient conditions for seven days and the absorbance characteristics of the aged layer were again evaluated using FTIR. As reflected in FIG. 1, FTIR trace "a" was obtained immediately after the SOG layer had been hard-baked and FTIR trace "b" was obtained after the hard-baked SOG layer had been aged for seven days.

As can be observed by comparing the peaks of the traces illustrated in FIG. 1, immediately after the hard-baking step the SOG layer still clearly included minor components of N—H and Si—H bonds in addition to the majority Si—O bonds. However, after seven days the conversion of the less stable bonds N—H and Si—H to Si—O bonds had progressed to a degree that the N—H and Si—H peaks were substantially reduced.

FIG. 2A is a graph tracking the changes in the measured thickness (Å) and reflective index (R.I.) of a SOG layer over the course of about 24 hours and FIG. 2B is a similar graph tracking changes in thickness and R.I. for about a week. FIG. 3A is a graph tracking the changes in the measured etch rate of the SOG layer over the course of about 24 hours and FIG. 3B is a similar graph tracking the changes in the measured etch rate for about a week. The SOG layer was formed by depositing a SOG composition on a substrate to a thickness of about 3,400 Å. This deposited SOG layer was then hard-baked at a temperature of about 400° C. for about 60 minutes under an oxidizing atmosphere, typically containing oxygen and/or water vapor. The R.I. and thickness of the SOG layer were then repeatedly measured to obtain the data presented in FIGS. 2A–B. In FIGS. 2A–B, the R.I. measurements are denoted by the symbol □ and the thickness measurements are denoted by the symbol ♦. The etch rate of the aging SOG layer was also repeatedly measured using a wet oxide etchant containing hydrogen fluoride (HF) under substantially constant etch conditions to obtain the data presented in FIGS. 3A–B for the purpose of examining the SOG etch rate as a function of the delay between the formation of the SOG layer and start of the wet etch.

As shown in FIGS. 2A–B and 3A–B, the R.I., thickness and etch rate of the SOG layer vary over time, thus complicating efforts to control the SOG etch process and increasing the chance of overetching or underetching such a SOG layer. Aging in oxidizing atmosphere may prevent such problems, but the aging takes long time to delay manufacturing process.

SUMMARY OF THE INVENTION

The exemplary embodiments of the present invention provide methods for forming silicon oxide layers during the processing of semiconductor devices in which a SOG layer including a polysilazane component is cured using an oxidant solution and typically one or more thermal treatments to convert the SOG layer into a silicon oxide layer. The oxidant solution may include one or more oxidants including, for example, ozone, peroxides (such as $H_2O_2$), permanganates (such as $KMnO_4$), hypochlorites (such as $CaCl_2O_2$ and NaClO), chlorites (such as $NaClO_2$), chlorates (such as $NaClO_3$), perchlorates (such as $KClO_4$), hypobromites (such as $CaBrO_2$ and NaBrO), bromites (such as $NaBrO_2$), bromates (such as $NaBrO_3$), hypoiodites (such as $CaI_2O_2$ and NaIO), iodites (such as $NaIO_2$), iodates (such as $LiIO_3$, $Ca(IO_3)_2$ and $KIO_3$) and strong acids (such as $H_2SO_4$ and $HNO_3$). The oxidant concentration in the oxidant solution may range from about 1 ppm to about 40 wt % depending on the oxidant or oxidants selected and the oxidant solution temperature may range from about 5° C. to about 125° C., more typically between about 25° C. and about 80° C. and the oxidant solution may be applied to the SOG layer by any conventional method such as dipping or immersing the semiconductor substrates in an oxidant solution bath, or by applying the oxidant solution to the surface of the SOG layer using spray or puddle techniques.

DETAILED DESCRIPTION OF EXEMPLARY EMBODIMENTS OF THE INVENTION

Figure 1:
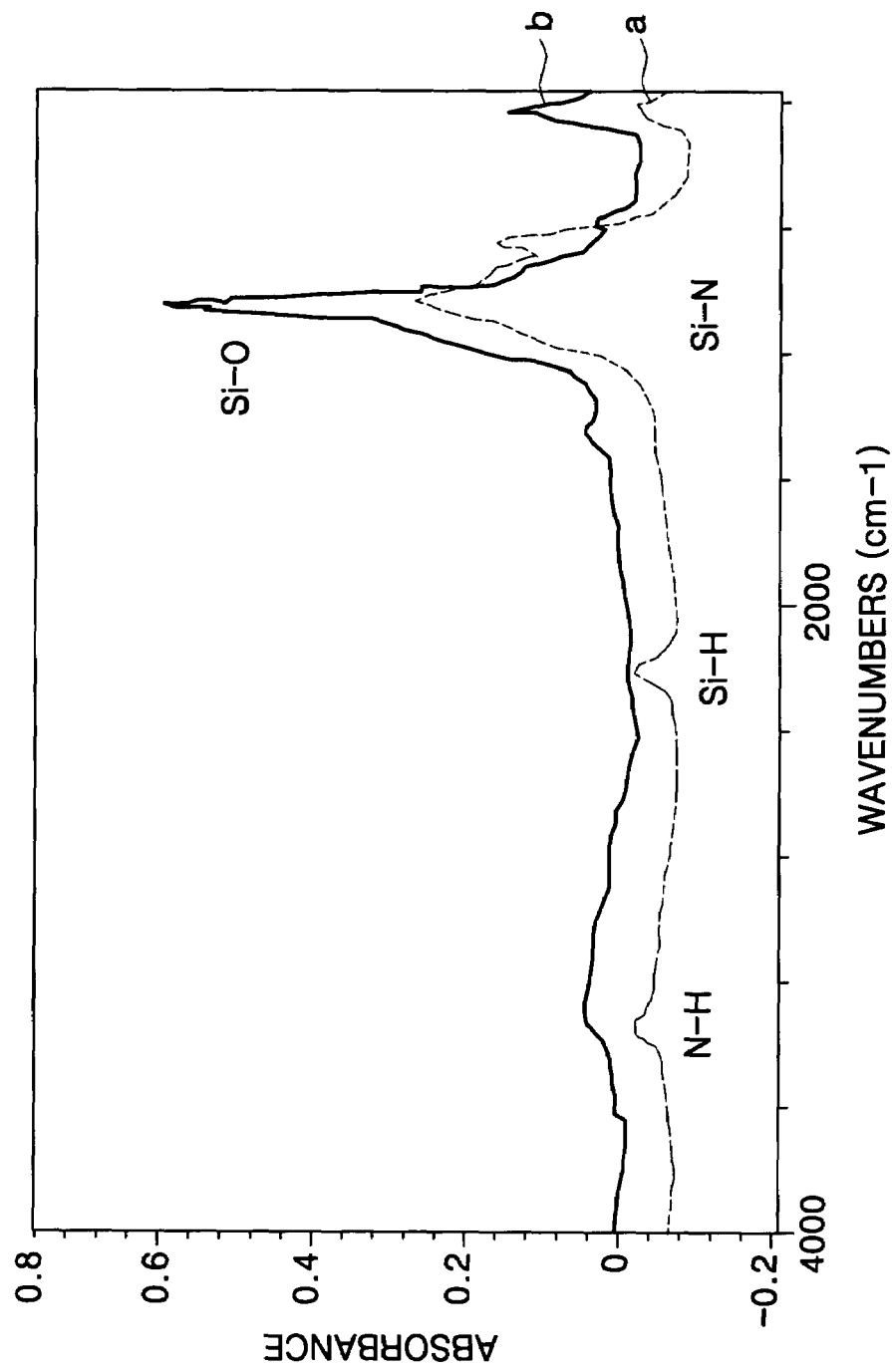
FIG. 1 is a Fourier Transform Infrared Spectroscopy (FTIR) graph illustrating the absorbance characteristics of a SOG layer both immediately after hard-baking and after the hard-baked SOG layer was maintained for an additional seven days under ambient conditions.
Figure 2A:
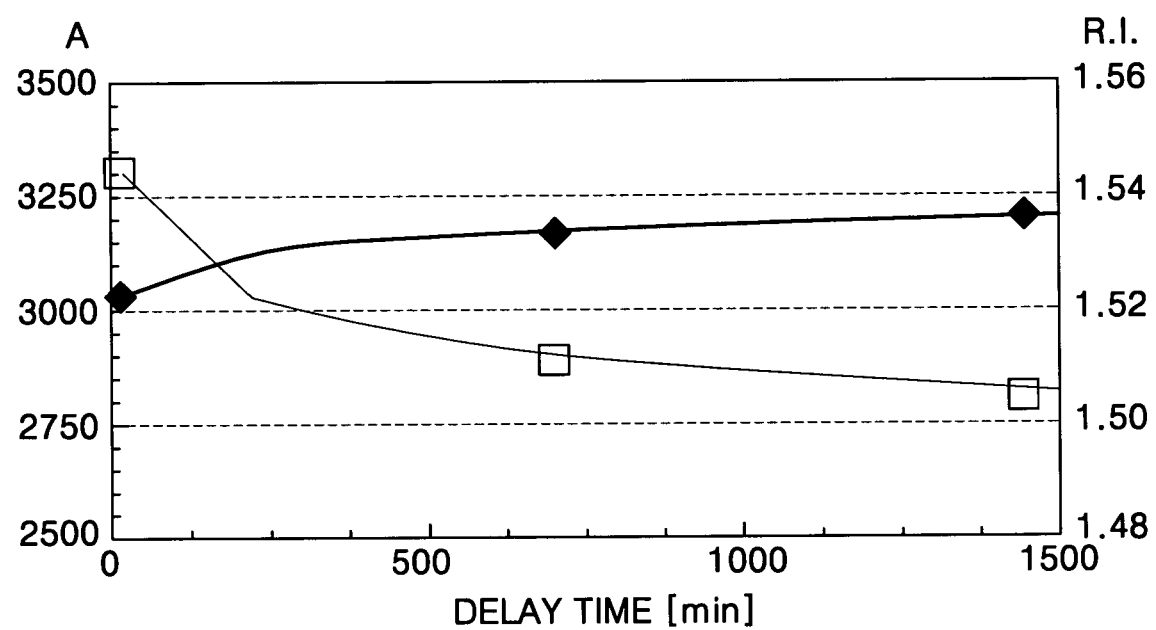
FIGS. 2A–B are graphs reflecting changes in the measured thickness and reflective index (R.I.) of a polysilazane hard-baked SOG layer over the course of about 24 hours and one week respectively.
Figure 2B:
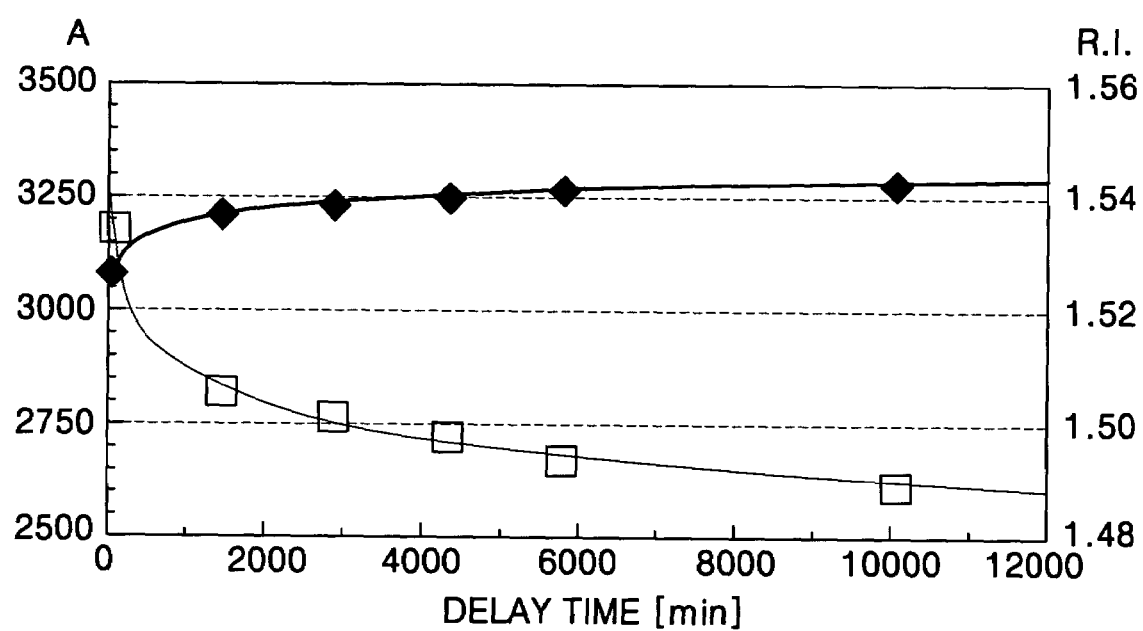
Figure 3A:
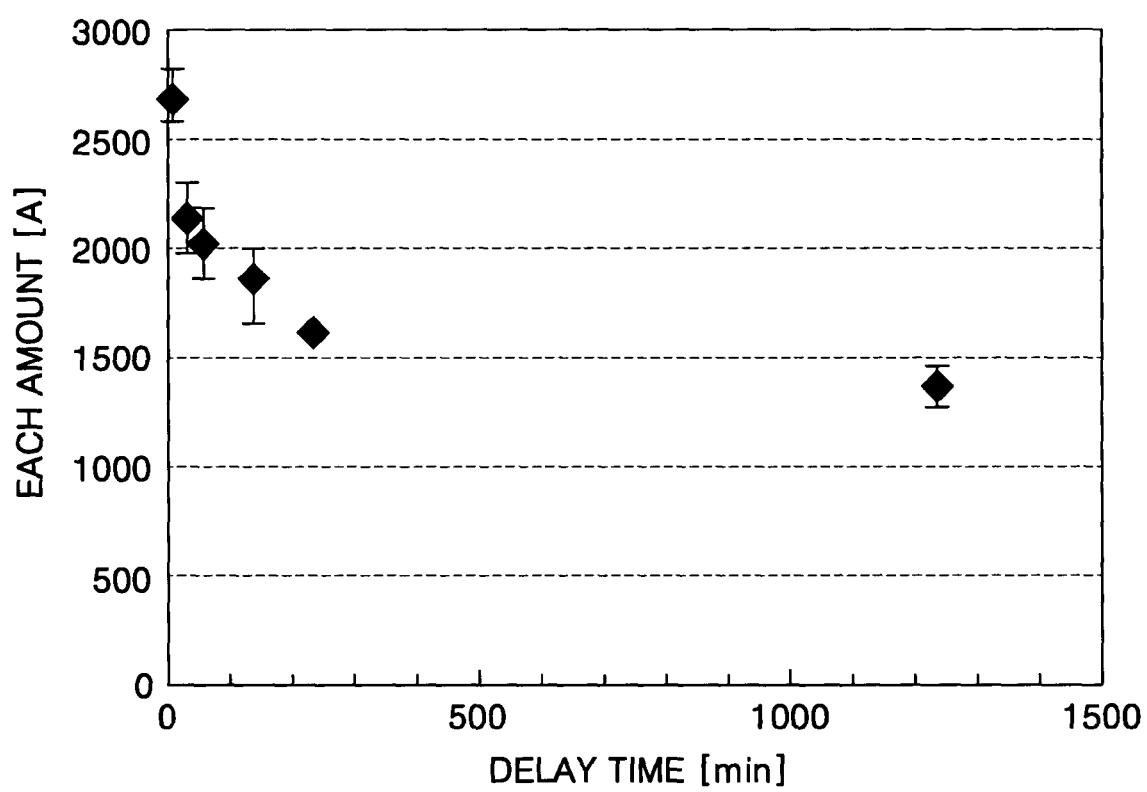
FIGS. 3A–3B are graphs tracking the changes in the measured etch rate of the SOG layer over the course of about 24 hours and one week respectively.
Figure 3B:
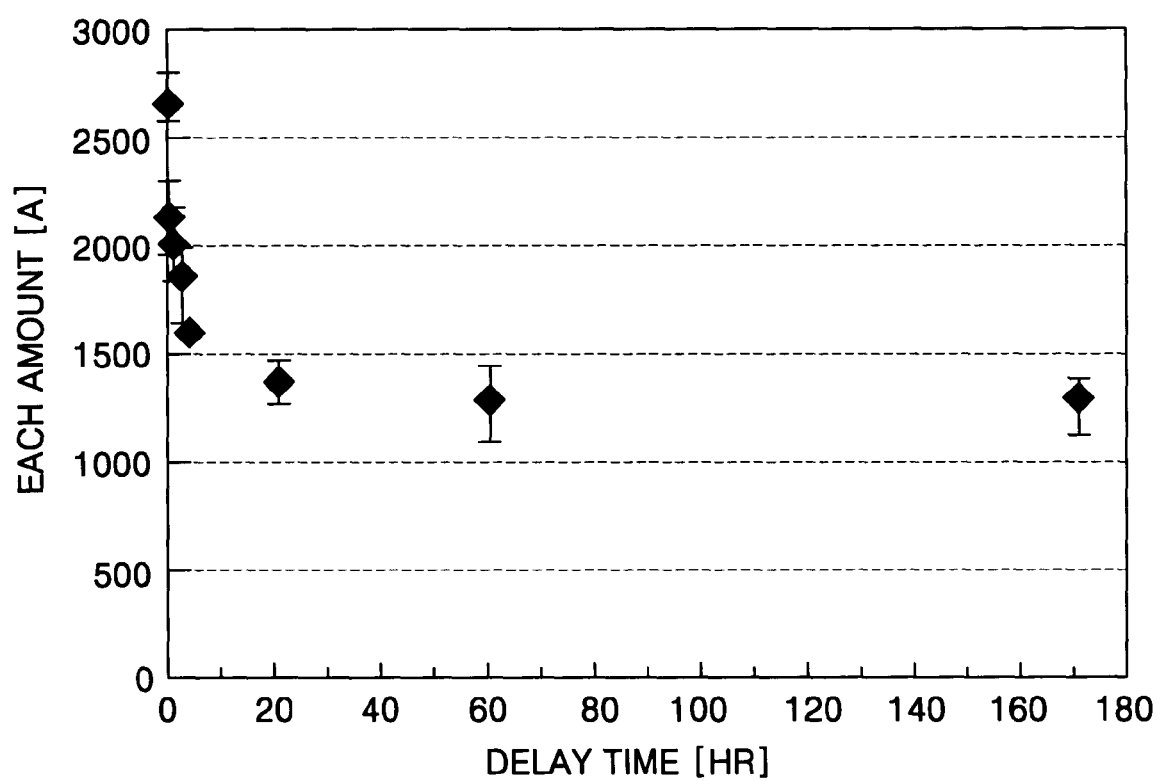

Exemplary embodiments of the invention provide methods for curing SOG layers using aqueous oxidant solutions to form silicon oxide layers suitable for use in the manufacture of VLSI and ULSI semiconductor devices. SOG compositions that may be used in the exemplary embodiments of the invention will typically include a polysilazane, such as perhydropolysilazane (PHPS), having the general formula —$(SiH_2NH_2)_n$— where n represents a positive integer. Polysilazanes may be prepared by reacting a halosilane with a Lewis base to obtain a complex compound and then reacting the complex compound with ammonia. Polysilazane may also be prepared by: (i) reacting a silicon halide, such as $SiC_4$ or $SiH_2Cl_2$, with an amine; (ii) polymerizing silazane into polysilazane using an alkali metal halide catalyst; or (iii) dehydrogenating a silane compound utilizing a transition complex metal compound and an amine compound.

SOG compositions useful in the exemplary embodiments of the invention will typically include a solution of one or more polysilazane compounds. Both inorganic and organic solvents may be used in preparing the SOG compositions, and aromatic, aliphatic or ether-type solvents, such as toluene, benzene, xylene, dibutylether, diethylether, THF (tetrahydrofuran), PGME (propylene glycol methoxy ether), PGMEA (propylene glycol monomethyl ether acetate) and hexane (and other cycloalky compounds) have been found useful. When utilizing PHPS as the polysilazane, the PHPS content of the SOG composition will typically be between about 5 wt % and about 30 wt %. SOG solutions having PHPS concentrations above about 30 wt % may exhibit decreased stability that may reduce the useful lifetime of the solution and/or may increase the likelihood of defects such as cracks or a lack of uniformity in the resulting SOG layer. SOG compositions having PHPS concentrations below about 5 wt % may increase the difficulty in controlling the thickness of the resulting SOG layer and will increase the volatile organic emissions produced for a given SOG layer thickness. Accordingly, SOG compositions useful in exemplary embodiments of the invention may typically comprise between about 5 wt % to about 30 wt % PHPS and about 70 wt % to 95 wt % solvent, based on the total weight of the composition. These SOG compositions may be applied to the surface of a semiconductor substrate using spin coating or spray coating to form a generally planar surface layer.

The polysilazanes utilized in the present invention may be prepared by any of the methods described above to have range of molecular weights and may be further fractionated according to molecular weight to prepare SOG compositions including specific polysilazane molecular weight ranges. For example, PHPS may be synthesized and fractionated to prepare SOG compositions in which the PHPS has a weight average molecular weight between about 1,000 and about 8,000. The particular range of weight average molecular weight(s) of the included polysilazane compound(s), the polysilazane content of the SOG composition and the solvent(s) utilized will affect the viscosity of the SOG composition with larger molecules and increasing polysilazane content tending to increase the viscosity.

In addition, when the polysilazane(s) incorporated in a SOG composition have a molecular weight dispersion degree, i.e., the ratio of weight average molecular weight to the number average molecular weight, of less than about 3.0, the fractionation efficiency and yield may be depressed. However, the polysilazane(s) incorporated in a SOG composition have a molecular weight dispersion degree greater than about 4.0, the uniformity of a silicon oxide layer formed by curing such a SOG composition may be decreased.

The SOG composition may also include one or more compound containing boron, fluorine, phosphorus, arsenic, carbon, oxygen, or mixtures thereof, for the purpose of modifying the properties of the resulting SOG and silicon oxide layers. For example, the incorporation of boron compounds and/or phosphorus compounds in a SOG composition may be used to produce silicon oxide layers having characteristics associated with a conventional boron silicate glass (BSG), BPSG, or phosphorous silicate glass (PSG) layer.

The viscosity of the SOG composition applied to a semiconductor surface may affect the planarity of both the resulting SOG layer and the silicon oxide layer formed by curing the SOG layer. Improved uniformity and planarity may be achieved with SOG compositions having viscosities within a range of about 1 to 10 mPa s at a shear rates between about 10 and about 1,000 1/s.

According to the exemplary embodiments of the invention, oxidant compositions useful for curing the SOG compositions to form silicon oxide will typically be an aqueous oxidant solution. The oxidant solution may include one or more oxidants including, for example, ozone, peroxides (such as $H_2O_2$), permanganates (such as $KMnO_4$), hypochlorites (such as $CaCl_2O_2$ and NaClO), chlorites (such as $NaClO_2$), chlorates (such as $NaClO_3$), perchlorates (such as $KClO_4$), hypobromites (such as $CaBrO_2$ and NaBrO), bromites (such as $NaBrO_2$), bromates (such as $NaBrO_3$), hypoiodites (such as $CaI_2O_2$ and NaIO), iodites (such as $NaIO_2$), iodates (such as $LiIO_3$, $Ca(IO_3)_2$ and $KIO_3$) and strong acids (such as $H_2SO_4$ and $HNO_3$).

The oxidant concentration in the oxidant solution may range from about 1 ppm to about 40 wt % depending on the oxidant or oxidants selected and the oxidant solution temperature may range from about 5° C. to about 125° C., more typically between about 25° C. and about 80° C. The oxidant solution may be applied to the SOG layer by dipping or immersing the semiconductor substrates in an oxidant solution bath, or by applying the oxidant solution to the surface of the SOG layer using spray or puddle methods.

Depending on the thickness and polysilazane content of the SOG layer being treated, the application method, the combination of oxidant(s) and the oxidant solution temperature may be selected to cure the SOG layer being treated within a treatment time of between about one minute and about 30 minutes. The oxidant solution may be an aqueous solution of ozone having the concentration between about 1 ppm and about 200 ppm. In exemplary embodiments of the present invention, the oxidant solution may be, for example, a solution having an ozone concentration between about 5 ppm and 100 ppm at a temperature of between about 20° C. and 40° C. Additionally, the oxidant solution may be an aqueous solution of hydrogen peroxide having the concentration between about 0.5 wt % and about 30 wt % at a temperature of between about 25° C. and about 90° C. The oxidant solution may be an aqueous solution of ammonium hydroxide having the concentration sufficient to establish a weight ratio with the concentration of hydrogen peroxide of between about 1:3 and 1:10. In exemplary embodiments of the present invention, a solution of ammonium hydroxide and hydrogen peroxide in a ratio of about 1:4 comprising between about 1 wt % and about 30 wt % of the solution at a temperature between about 30° C. and about 90° C. In another exemplary embodiments of the present invention, an aqueous solution of hydrogen peroxide and ammonium hydroxide having the concentration of hydrogen peroxide between about 3 wt % and about 10 wt % and the concentration of the ammonium hydroxide between about 0.5 wt % and about 5 wt % at a temperature of between about 40° C. and about 80° C.

Using a spin coating technique, a SOG composition may be coated onto a semiconductor substrate having surface discontinuities to form a SOG coating having a substantially planar surface. The surface discontinuities on the semiconductor substrate may result from conductive patterns such as gate electrode structures, capacitor structures, or conductive metal wiring patterns such as word lines or bit lines, which produce a stepped topography on the substrate surface. Such stepped topography may also be the result of other structures that result in projecting and/or recessed regions on the substrate surface such as the trench structures formed during the manufacture of shallow trench isolation (STI) structures. According to the exemplary embodiments of the invention, such a SOG layer can be used to form an insulating silicon oxide layer that may be utilized as an insulation interlayer over and/or between such stepped structures or discontinuities on the substrate surface.

Figure 4A:
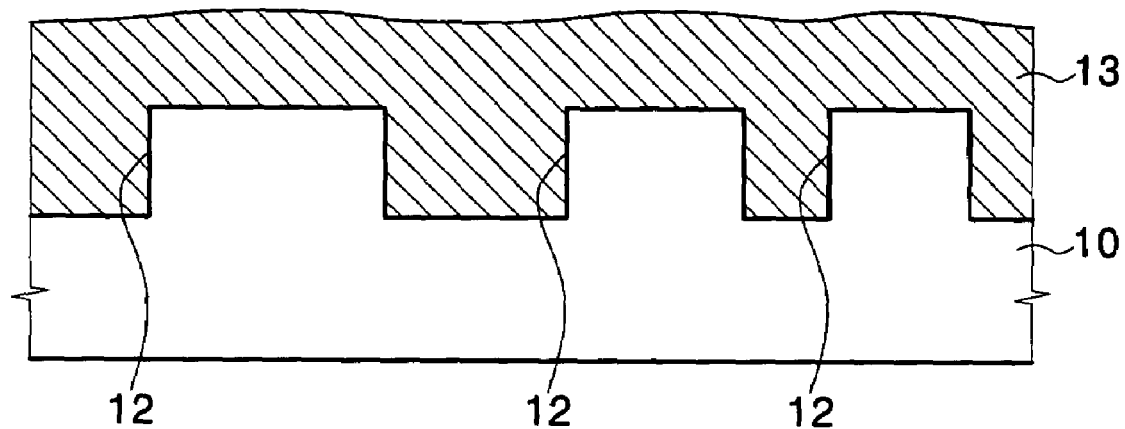
FIGS. 4A–4K are cross-sectional views illustrating a method of forming a silicon oxide layer in a semiconductor manufacturing process according to an exemplary embodiment of the invention.

According to an exemplary embodiment of the invention, the substantially planar SOG layer formed on the structures found on the substrate surface may be converted to a substantially planar layer of silicon oxide through treatment with an oxidant solution as well as a hard bake conducted in an oxidizing atmosphere. FIGS. 4A–4K are cross-sectional views illustrating a method of forming a series of silicon oxide layers in a semiconductor manufacturing process according to an exemplary embodiment of the invention. As illustrated in FIG. 4A, a p-type substrate 10, comprising a semiconductor material such as silicon (Si), includes a series of trenches 12 etched into the substrate 10 to define isolation regions. The depth and width of the trenches 12 may vary depending on the particular design rules being utilized, but a depth of about 3,600 Å and a width of about 1,250 Å may be exemplary. A SOG composition including polysilazane and a solvent may then be applied to the substrate 10 both to fill the trenches 12 and coat the remaining surface of the substrate to form a substantially planar first SOG layer 13. Although the thickness of the SOG layer may vary depending on the particular semiconductor process, a thickness of about 2,000 Å to 9,000 Å, may be exemplary.

The first SOG layer 13 may then be pre-baked at a temperature of not more than about 400° C. for a soft bake time sufficient to evaporate substantially all of the first solvent from the SOG coating and thereby form the SOG layer. In exemplary embodiments of the present invention, the first SOG layer 13 may be pre-baked at a temperature of about 50° C. to about 350° C. for a time, typically 10 minutes or less, in order to remove the majority of the solvent from the first SOG layer. This pre-bake may be conducted at a substantially constant temperature or may be conducted under varying temperatures, for example with the temperature being increased in a linear or stepwise manner over the duration of the pre-bake process.

After having been pre-baked, the first SOG layer 13 may be subjected to an etchback process to reduce the thickness of the first SOG layer 13, increase the planarity of the surface and/or expose portions of the surface of the semiconductor substrate 10. After having been pre-baked, the first SOG layer 13 may also be subjected to an additional thermal treatment such as hard bake or main bake. The hard bake is conducted in an oxidizing atmosphere that includes oxygen and/or water vapor and, the main bake is conducted in a substantially non-oxidizing atmosphere of, for example, nitrogen and/or argon, or a vacuum. For example, the first SOG layer 13 may be subjected to heated at a temperature between about 300° C. and about 600° C. for a time sufficient to densify the first SOG layer or at a temperature between about 300° C. and about 600° C. for a time sufficient to increase a HF etch resistance of the first SOG layer by at least 50%. In exemplary embodiments of the present invention, the first SOG layer 13 is subjected to a hard bake at a temperature of about 300° C. to about 500° C. for period of between about 10 to about 120 minutes to suppress particle generation in an oxidizing atmosphere. When the hard bake is conducted in an oxidizing atmosphere, a portion of the PHPS in the first SOG layer formed on the structures is converted to silicon oxide.

Figure 4B:
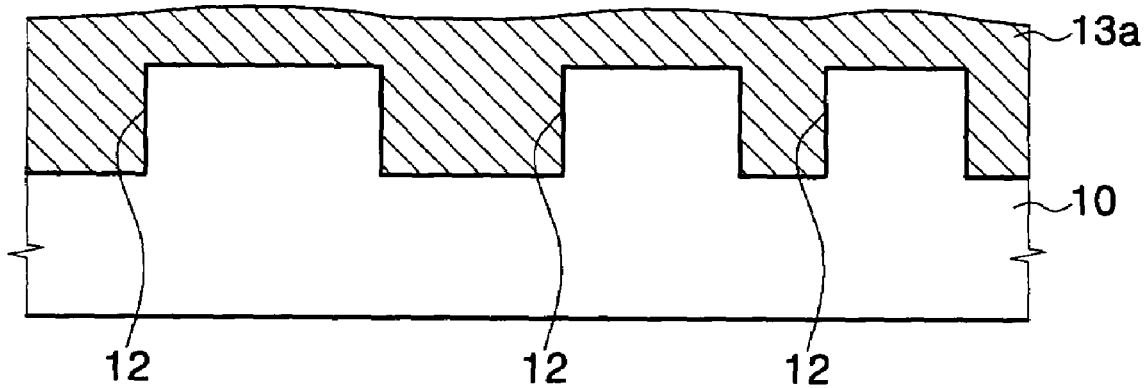

Referring to FIG. 4B, the first SOG layer 13 may then be treated with an oxidant solution at a temperature of about 0° C. to about 200° C. to cure the first SOG layer 13 and form a silicon oxide layer 13a. The oxidant solution may include one or more oxidants including, for example, ozone, peroxides, permanganates, hypochlorites, chlorites, chlorates, perchlorates, hypobromites, bromites, bromates, hypoiodites, iodites, iodates and strong acids. Various combinations of treatment duration, temperature, oxidant(s) and oxidant concentration(s) may be utilized to convert the first SOG layer 13 into a first silicon oxide layer 13a. During the curing process, substantially the entire remaining portion of PHPS, i.e., that portion that was not converted into silicon oxide when the first SOG layer 13 was baked in an oxidizing atmosphere, is converted to silicon dioxide.

Once formed, the first silicon oxide layer 13a may be subjected to additional processing to reduce the layer thickness, improve surface planarity, remove a portion of the silicon oxide layer and/or expose portions of the substrate. The additional processing may remove silicon oxide using a CMP process using abrasive particles of materials such as silica, ceria ($CeO_2$), alumina or manganesia ($Mn_2O_3$) in an abrasive slurry, a dry etch process utilizing an etchant gas such as $NH_xF_y$, $CF_x$ or $CH_xF_y$ (wherein x and y denote positive integers), or a wet etch process utilizing an etchant such as a HF solution to etch the silicon oxide.

The first silicon oxide layer 13a may also be subjected to an additional thermal process to increase the density of the layer, e.g., annealed or densified, at a temperature greater than that used for the hard bake process or main bake process. For example, the first silicon oxide layer 13a may be annealed at a temperature of between about 600° C. to about 1200° C. for between about 10 to about 120 minutes.

This annealing process may be performed under an atmosphere including oxygen, hydrogen, nitrogen, water vapor or a mixture thereof. This higher temperature treatment is possible in this instance because there are no underlying metal structures or patterns that would be damaged by such temperatures.

Figure 4C:
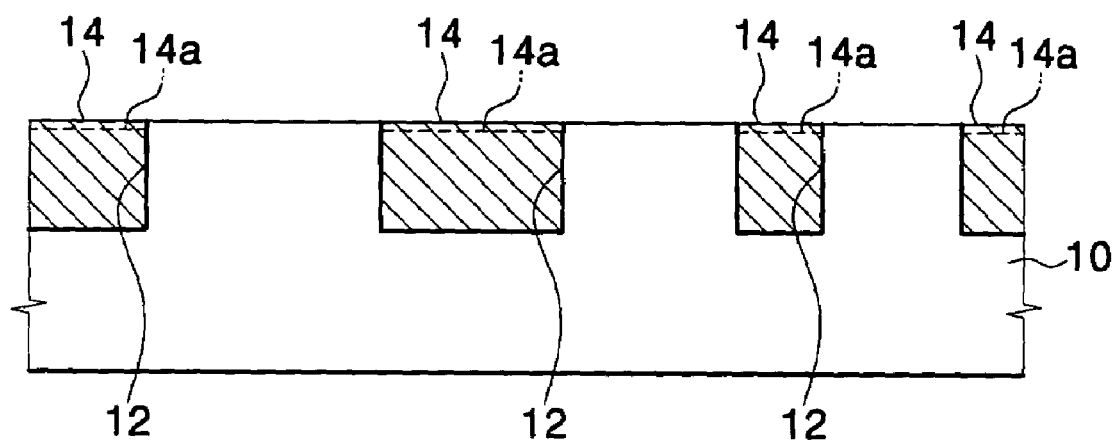

As illustrated in FIG. 4C, an upper portion of the silicon oxide layer 13a has been removed, typically by utilizing a CMP process or a dry or wet etchback process, to expose the upper surface of the semiconductor substrate 10 while leaving trenches 12 substantially filled with silicon oxide 14. When dry or wet etchback processes are utilized, either singly, in combination or subsequent to a CMP process, the silicon oxide layer 13a may be overetched to remove a portion of the silicon oxide filling the trenches 12 and expose upper sidewall portions of the trenches to produce an upper surface 14a of the silicon oxide that is recessed relative to the upper surface of the semiconductor substrate.

Such overetching may be used to reduce void generation in the trenches 12, particularly when coupled with the application of an additional SOG layer that will tend to fill any exposed voids and refill the space opened at the top of the trenches by the overetch.

Figure 4D:
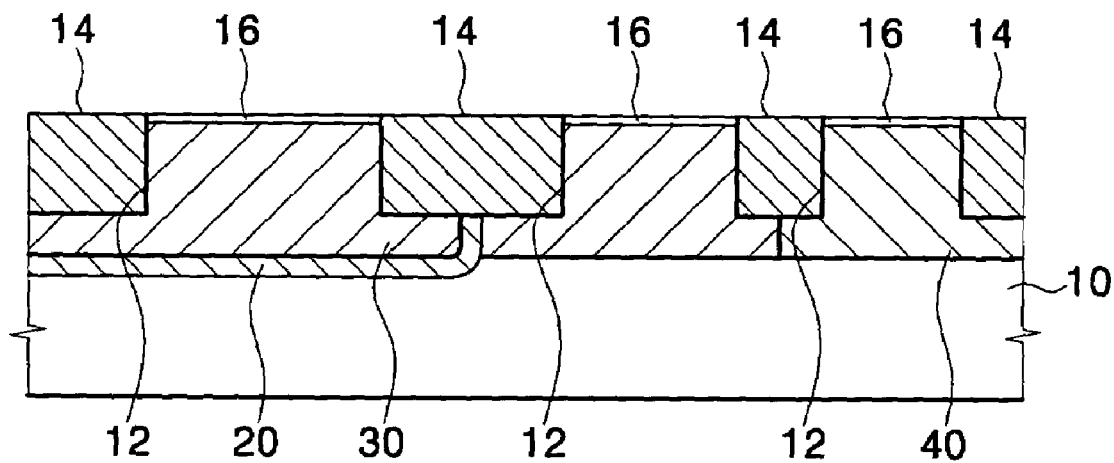

Referring to FIG. 4D, an n-type semiconductor region 20 may be formed by doping a region of the semiconductor substrate 10 with an n-type impurity, such as phosphorous or arsenic, in a region intended for forming memory cells (cell array region). A p-type well 30 may be formed by doping a region of the semiconductor substrate 10 with a p-type impurity, such as boron, in the cell array region and portions of a peripheral circuit region. Similarly, an n-type well 40 may be formed by doping an n-type impurity, such as phosphorous or arsenic, in portions of the peripheral circuit region.

In order to control device parameters such as threshold voltage $V_T$, an impurity such as boron may then be doped into the p-type well 30 and/or the n-type well 40. The surface portions of the p-type well 30 and/or the n-type well 40 may then be cleaned and the exposed surfaces of semiconductor substrate 10 oxidized to form a gate oxide layer 16 on the surface of the p-type well 30 and/or the n-type well 40. Although the thickness of the gate oxide layer 16 may vary depending on the particular semiconductor manufacturing process being used, a thickness of between about 40 Å and about 200 Å may be exemplary.

A polysilicon layer may then be formed on the substrate 10 and the gate oxide layer 16 by depositing polycrystalline silicon doped with an n-type impurity, such as phosphorous, using a low pressure chemical vapor deposition (LPCVD) method. Although the thickness of the polysilicon layer may vary depending on the particular semiconductor manufacturing process being used, a thickness of between about 500 Å and about 4,000 Å may be exemplary. Tungsten silicide and tungsten layers may then be sequentially formed on the polysilicon layer using a sputtering method. Although the thickness of the tungsten silicide layer and a tungsten layer may vary depending on the particular semiconductor manufacturing process being used, a thicknesses of between about 1,000 Å to about 2,000 Å for each layer may be exemplary. A silicon nitride layer may then be deposited on the tungsten layer using a LPCVD, or a plasma enhanced chemical vapor deposition (PECVD) method. Although the thickness of the silicon nitride layer may vary depending on the particular semiconductor manufacturing process being used, a thicknesses of between about 500 Å to about 2,000 Å may be exemplary.

Figure 4E:
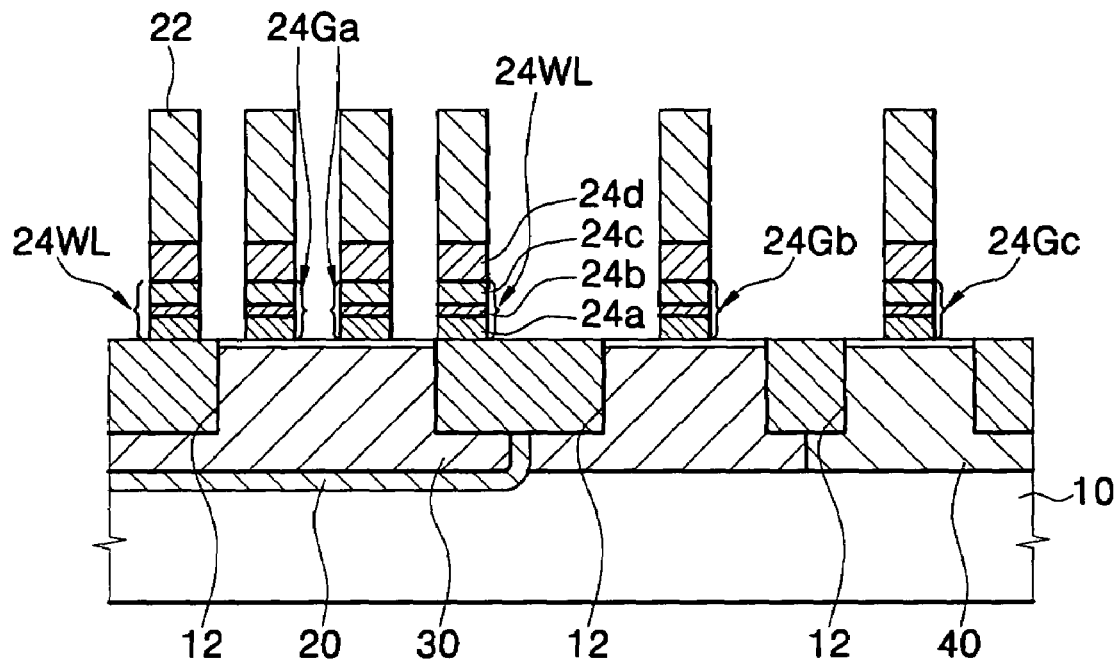

A photoresist film may then be formed on the silicon nitride layer and selectively exposed utilizing a mask or other suitable patterning technique. The exposed photoresist film may then be developed to form a photoresist pattern 22 for forming gate electrodes. As illustrated in FIG. 4E, the silicon nitride layer, tungsten layer, tungsten nitride layer, and polysilicon layer may then be sequentially etched by utilizing the photoresist pattern 22 as an etch mask to form gate electrodes 24Ga, 24Gb, 24Gc and word lines 24WL each including a polysilicon pattern 24a, a tungsten silicide pattern 24b, tungsten pattern 24c, and silicon nitride pattern 24d. As illustrated, gate electrodes 24Ga and word lines 24WL are formed in the cell array region and gate electrodes 24Gb and 24Gc are formed in the peripheral circuit region.

The gate electrodes 24Ga and word lines 24WL formed on the cell array region may be arranged and configured so that the gaps between adjacent electrodes may range from about 0.4 μm to about 1 μm. The aspect ratio, which is the ratio of the depth with respect to the width of the gap between adjacent structures, such as the gate electrodes 24Ga and the word lines 24WL, may range between about 5:1 and about 10:1 in the cell array region. On the other hand, the aspect ratio of the gap between the gate electrodes 24Gb and 24Gc formed in the peripheral circuit region, may be less than 1:1 in exemplary devices.

Figure 4F:
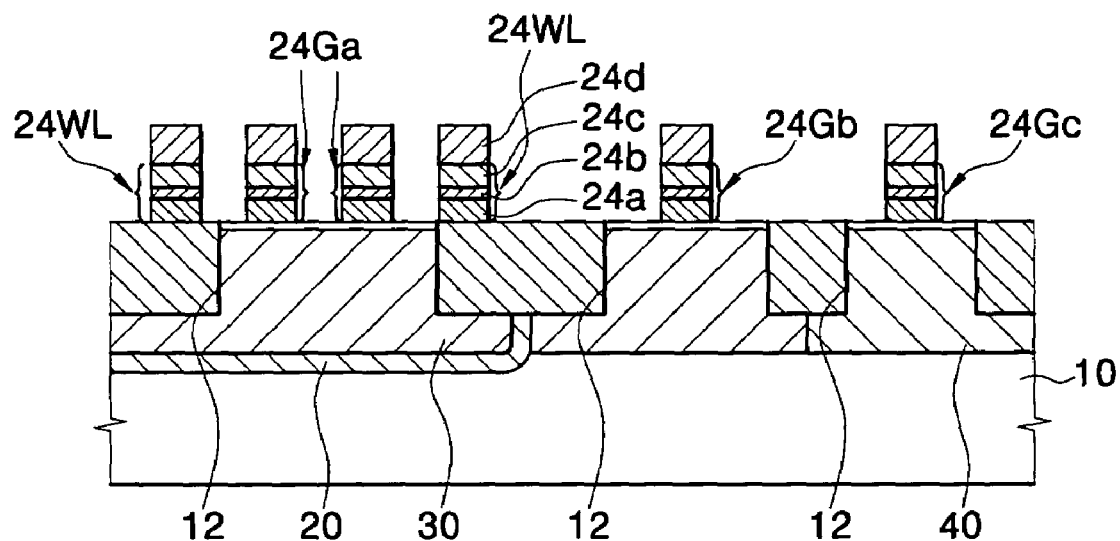
Figure 4G:
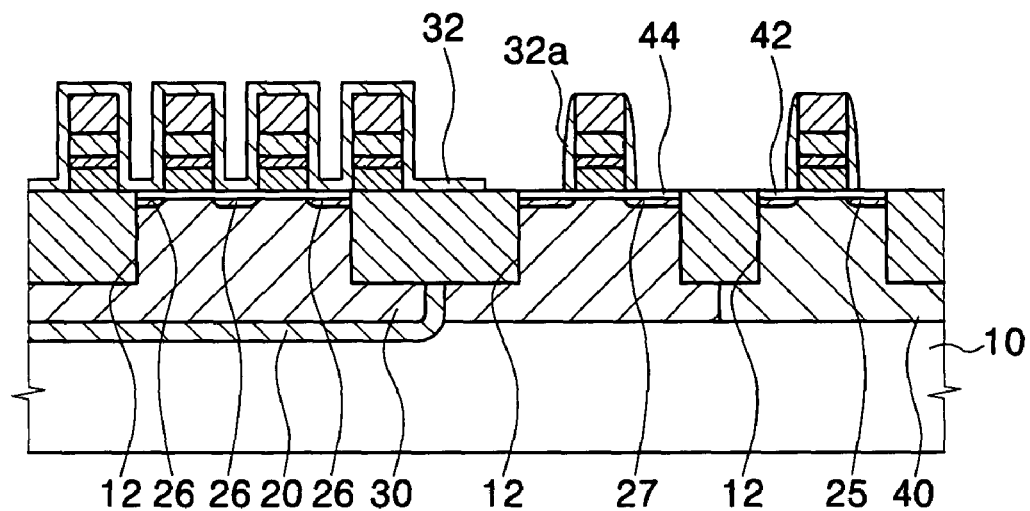

As illustrated in FIG. 4F, the photoresist pattern 22 is then removed from the gate electrodes and word lines. As illustrated in FIG. 4G, a p-type impurity doped region 25 may be formed in the n-type well 40 at both sides of the gate electrode 24Gc by doping a p-type impurity, such as boron. An n-type impurity doped region 27 may be formed in the p-type well 30 at both sides of the gate electrode 24Gb by doping an n-type impurity, such as phosphorous, arsenic or antimony, into the p-type well 30. Similarly, an n-type impurity doped region 26 may be formed in the p-type well 20 at both sides of gate electrodes 24Ga.

Referring to FIG. 4G, silicon nitride is deposited on the semiconductor substrate 10 using a chemical vapor deposition method to form a silicon nitride layer 32. Although the thickness of the silicon nitride layer 32 may vary depending on the particular semiconductor manufacturing process being used, a thicknesses of between about 200 Å and about 600 Å may be exemplary. Next, the portion of the silicon nitride layer 32 on the cell array region may be covered with a photoresist film, and the silicon nitride layer 32 on the peripheral circuit region may be anisotropically etched to form silicon nitride spacers 32a adjacent the sidewalls of the gate electrodes 24Gb and 24Gc (FIG. 4F) in the peripheral circuit region. Additionally, the silicon nitride layer may be etched without a photoresist film to form the silicon nitride spacers on the cell array and the peripheral circuit region.

Next, p+-type impurity doped regions (source and drain regions) may be formed by doping a p-type impurity, such as boron, into the n-type well 40 of the peripheral circuit region. In addition, n+-type impurity doped regions (source and drain regions) may be formed by doping an n-type impurity, such as phosphorus, arsenic or antimony, into the p-type well 30 of the peripheral circuit region.

Figure 4H:
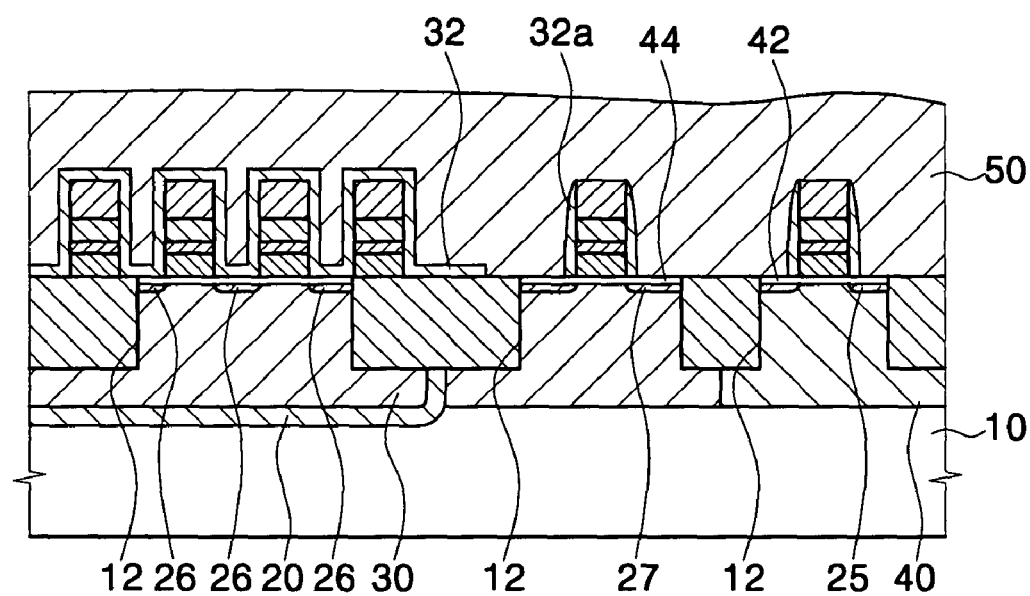

Referring to FIG. 4H, the semiconductor substrate 10 and the various gate electrodes and word line structures formed thereon are then coated with a SOG composition to form a second SOG layer 50. The second SOG layer 50 may be formed using a spin coating method with the thickness being sufficient to cover the gate electrodes 24Ga, 24Gb, 24Gc and word line 24WL structures. Although the thickness of the second SOG layer will vary depending on the process used and the structures to be covered, a thickness between about 2,000 Å and about 8,200 Å may be exemplary. The second SOG layer 50 may then be subjected to the hard-bake or main-bake treatment as described above with regard to the first SOG layer 13. After the hard-bake or main-bake, the second SOG layer 50 may be cured using an oxidant solution including one or more oxidants including, for example, ozone, peroxides, permanganates, hypochlorites, chlorites, chlorates, perchlorates, hypobromites, bromites, bromates, hypoiodites, iodites, iodates and strong acids. Various combinations of treatment duration, temperature, oxidant(s) and oxidant concentration(s) may be utilized to convert the second SOG layer 50 into a second silicon oxide layer 50a.

Figure 4I:
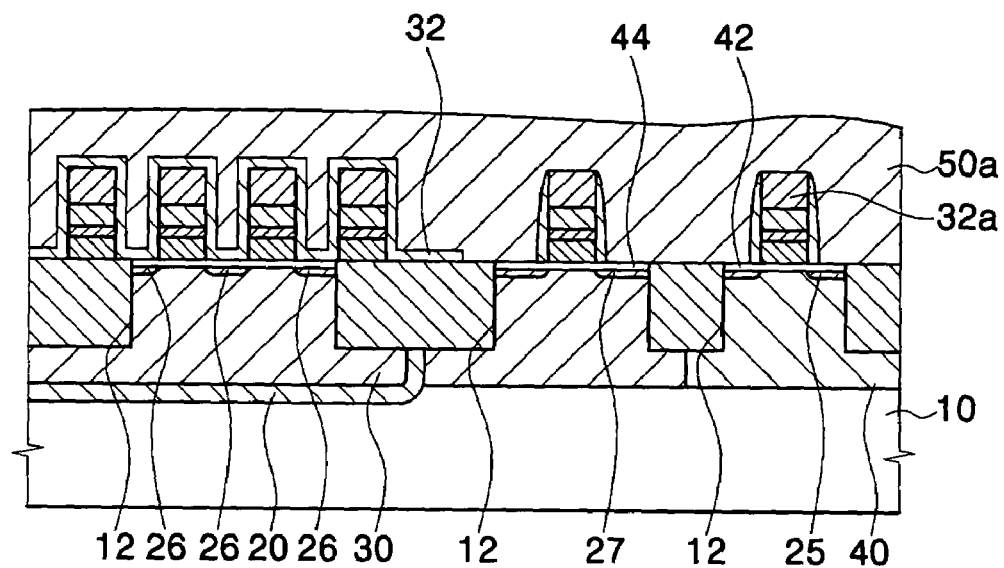

During the curing process, Si—N bonds in the second SOG layer 50 are oxidized to form Si—O bonds and convert the second SOG layer 50 into a second silicon oxide layer 50a. The thickness of second silicon oxide layer 50a may be decreased somewhat during this process, as illustrated in FIG. 4I.

The second silicon oxide layer 50a may then be heat-treated (or annealed) at a temperature of about 600° C. to 1200° C. as described above with regard to the first silicon oxide layer 13a. This higher temperature treatment is possible in this instance because the metal patterns present on the substrate are formed from a refractory metal, such as tungsten, that will suffer little damage at such temperatures.

Figure 4J:
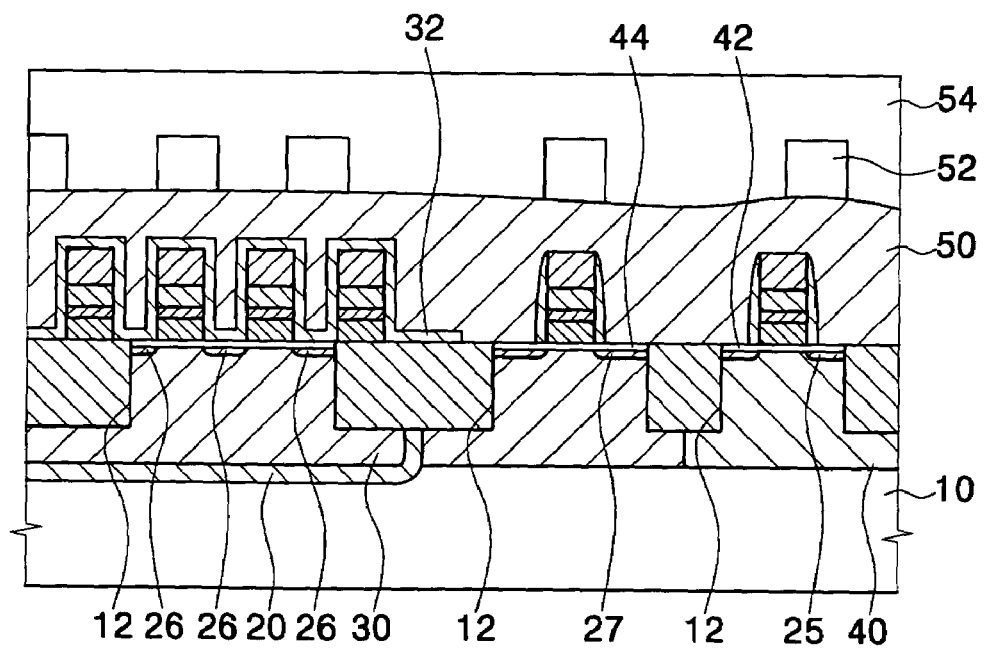

Referring to FIG. 4J, a metal layer may be formed by depositing a metal, such as aluminum, copper or tungsten, on the second silicon oxide layer 50a. The metal layer may be formed by a sputtering deposition method and may have an exemplary thickness of between about 4,000 Å to about 8,000 Å. Metal patterns 52 may be formed by patterning and etching the metal layer utilizing a conventional photolithography process including forming openings in the silicon oxide to expose portions of the gate electrode structures and depositing a metal layer on the silicon oxide. A third SOG layer 54 having a substantially planar surface may then be formed on the semiconductor substrate to cover the metal patterns 52 and fill the gaps formed between adjacent metal lines. The third SOG layer 54 may be formed by spin coating a SOG composition and may be formed to a range of thicknesses including, for example, between about 3,000 Å and 4,500 Å (as measured on a test or dummy wafer).

Figure 4K:
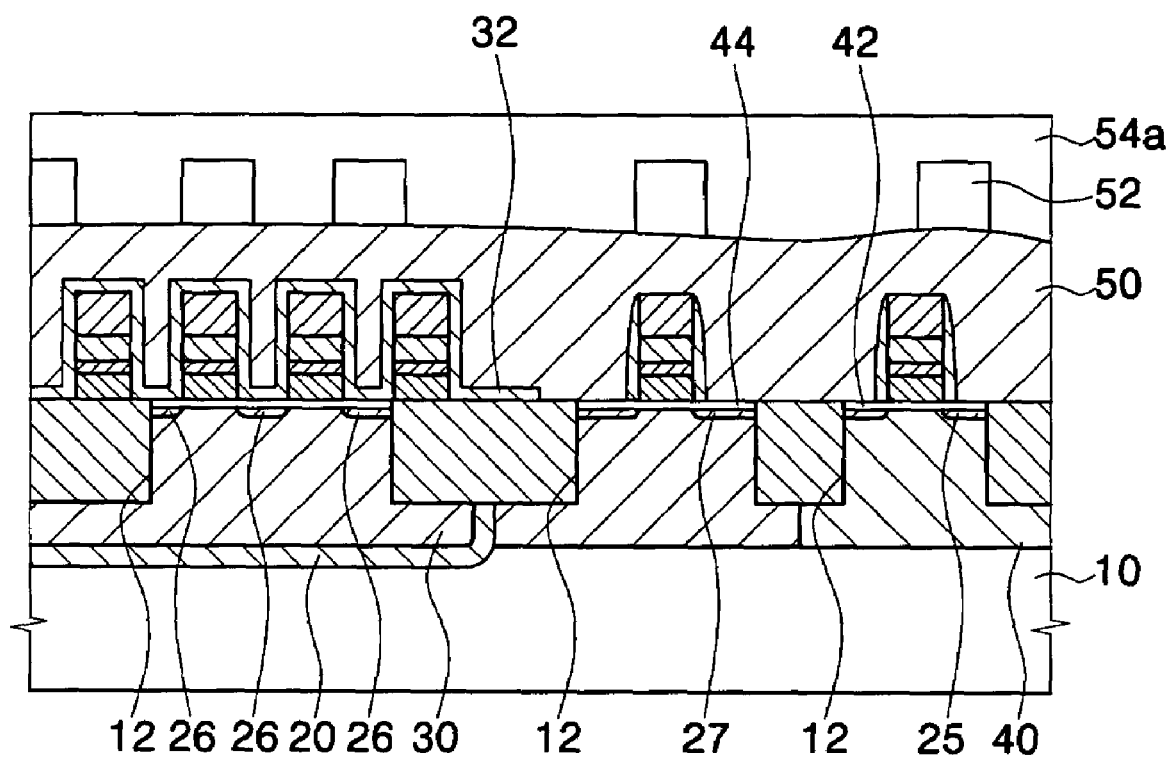

Referring to FIGS. 4J and 4K, the third SOG layer 54 may be pre-baked in the manner described above with regard to the first and second SOG layers 13, 50. The third SOG layer 54 may then be cured using an oxidant solution including one or more oxidants as described above with regard to the first and second SOG layers 13, 50. Various combinations of treatment duration, temperature, oxidant(s) and oxidant concentration(s) may be utilized to convert the third SOG layer 54 into a third silicon oxide layer 54a having a substantially planar surface.

Also, an additional conductive layer may be formed by patterning and etching the conductive layer utilizing a conventional photolithography process including forming openings in the silicon oxide to expose portions of the metal layer and depositing a conductive layer on the silicon oxide.

Light Absorbance of a Silicon Oxide Layer

The light absorbance of a silicon oxide layer formed according to an exemplary embodiment of the invention was evaluated by coating a bare test wafer with a SOG composition including polysilazane to form a SOG layer having a thickness of about 3,400 Å. This SOG layer was baked at a temperature of about 400° C. for about 30 minutes under an oxygen atmosphere.

Figure 5:
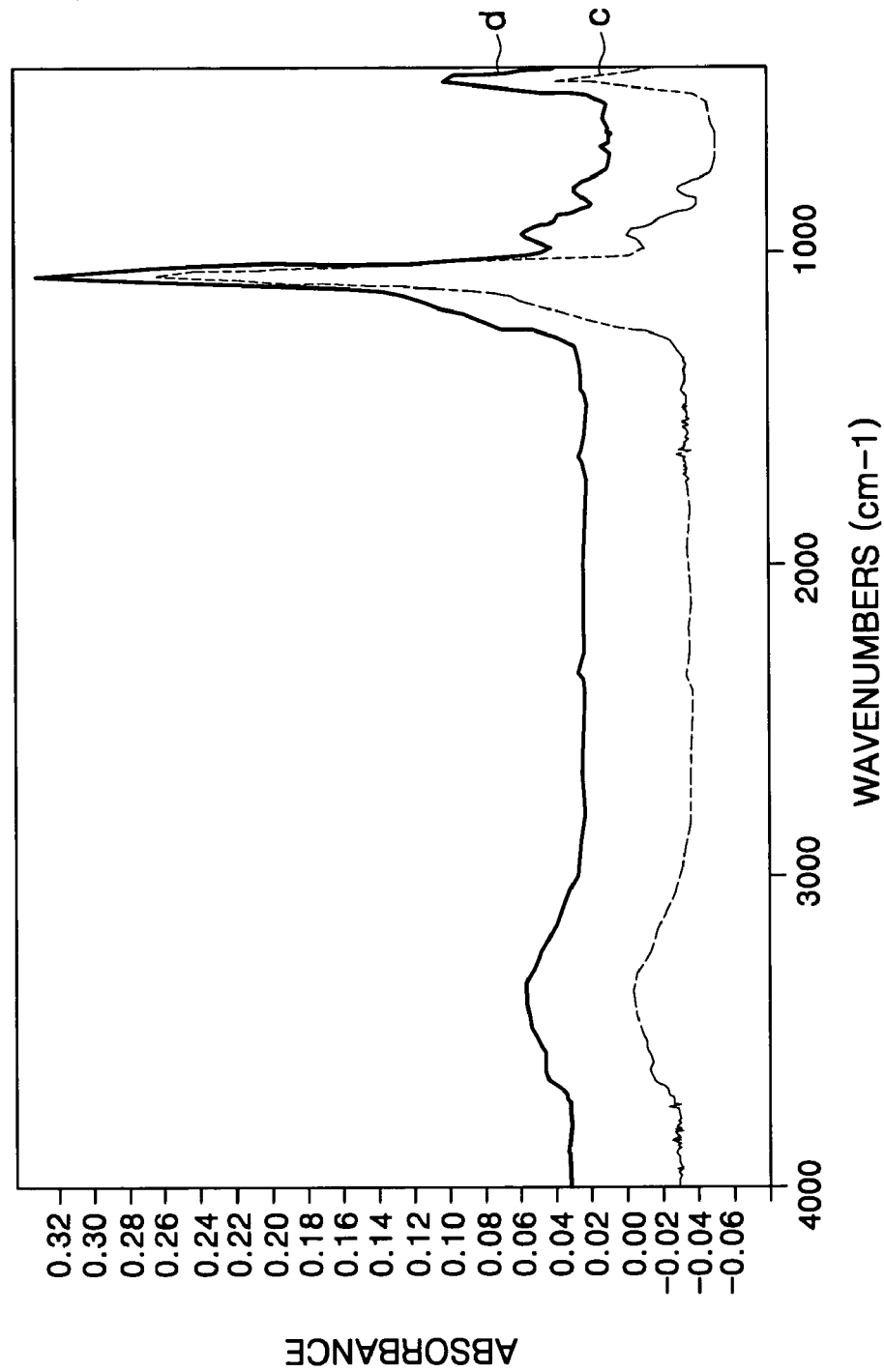
FIG. 5 is an FTIR diagram showing the light absorbance of a silicon oxide layer formed by curing a SOG layer according to an exemplary embodiment of the invention.

An oxidant solution was then applied to the baked SOG layer for about ten minutes to convert the SOG layer into a silicon oxide layer. The light absorbance of the silicon oxide layer formed by converting the SOG layer with the oxidant solution was then analyzed using the FTIR method. The treatment using the oxidant solution was done without time delay after hard baking. The results of this analysis are provided in FIG. 5 as trace c. As shown in FIG. 5 trace c, there is no time delay between wet oxidation and light absorption measurement. The light absorbance of this silicon oxide layer was analyzed again after maintaining the test wafer under ambient conditions for an additional three days after the curing process had been completed. The results of the analysis of the aged silicon oxide layer are provided in FIG. 5 as trace d. As shown in FIG. 5 trace d, there is time delay between wet oxidation and light absorption measurement. The traces c and d are plotted with a vertical offset of about 0.06 to allow their profiles to be compared more easily.

As shown in FIG. 5, the light absorbance of the silicon oxide layer immediately after its formation and the light absorbance obtained three days after the curing are substantially identical. This result indicates that the silicon oxide layer formed by the wet oxidation of a SOG layer does not exhibit the absorbance in the wavelength regions associated with the presence of N—H, Si—H, Si—N and Si—H bonds that is detected in a conventional baked SOG layer (FIG. 1) and instead indicates that the cured layer includes substantially only Si—O bonds. This result also indicates that the silicon oxide layer formed by the wet oxidation of a SOG layer is substantially complete, uniform and relatively stable when compared with a baked SOG layer. This compositional stability may be reflected in more consistent etch rates and dielectric properties in the silicon oxide layer, thereby improving process control and device performance.

Test wafers having a silicon oxide layer prepared by the wet oxidation of a SOG layer were prepared and the light absorbance characteristics of the resulting cured silicon oxide layer was analyzed using a FTIR method. The results of this analysis are provided in FIG. 6 as trace e. Test wafers having cured silicon oxide layers were then annealed in either a nitrogen atmosphere for about one hour at a temperature of 750° C. or in an oxidizing atmosphere for about one hour, again at a temperature of 750° C. The light absorbance characteristics of the annealed silicon oxide layers were then analyzed using a FTIR method. The results of this analysis are provided in FIG. 6 in which trace f corresponds to the oxide layer after a nitrogen atmosphere anneal and trace g corresponds to the oxide layer after an oxidizing atmosphere anneal. The FTIR traces e, f and g are plotted with a vertical offset to allow their profiles to be compared more easily.

Figure 6:
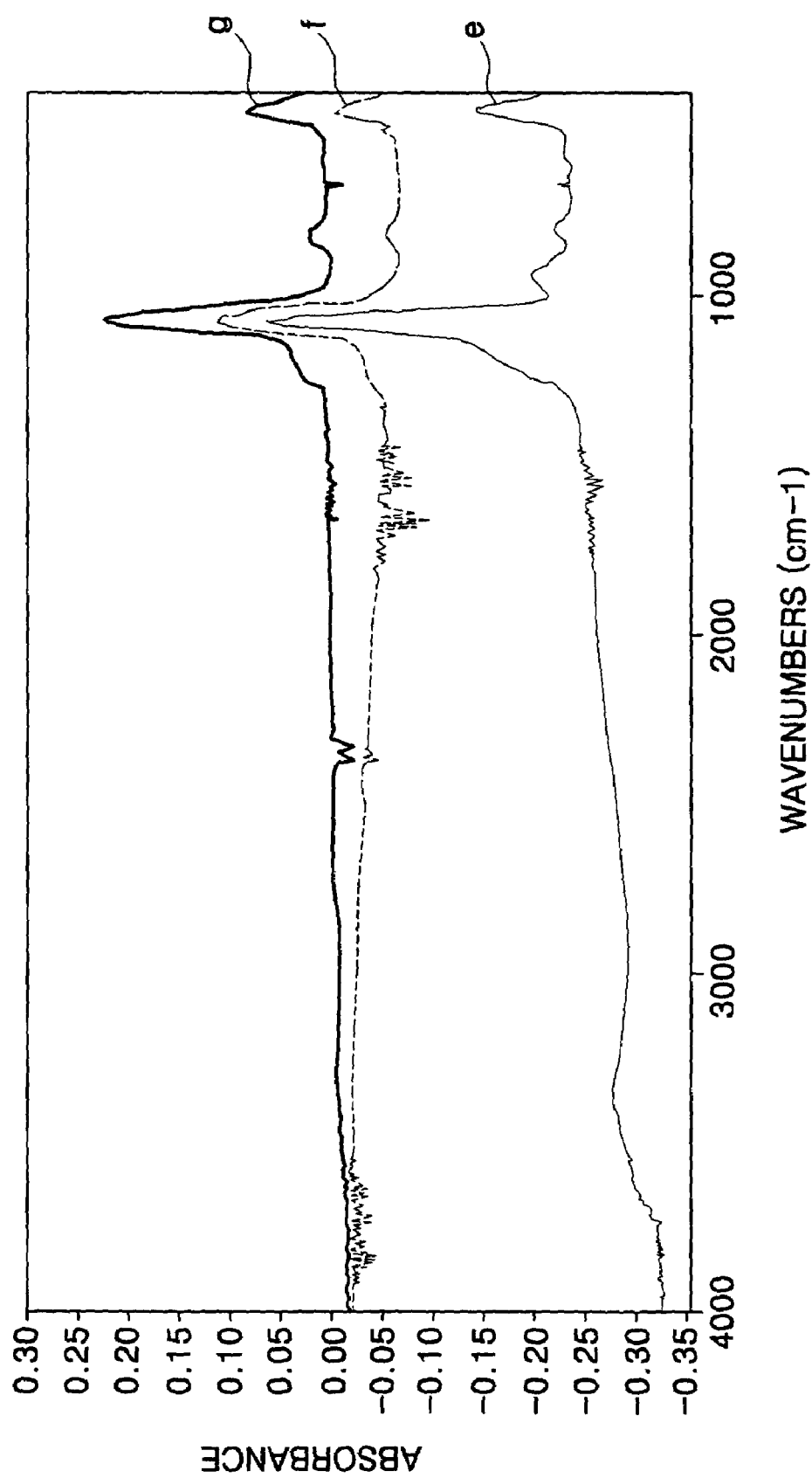
FIG. 6 is an FTIR diagram showing the light absorbance of a silicon oxide layer formed by curing a SOG layer according to an exemplary embodiment of the invention.

As reflected in the data illustrated in FIG. 6, when a SOG layer is converted into a silicon oxide layer using an oxidant solution according to the exemplary embodiments of the invention, the resulting silicon oxide layer is stable and largely unaffected by a subsequent anneal in either an inert atmosphere, such as nitrogen, or an oxidizing atmosphere. The FTIR light absorbance data does not reflect wavelength peaks associated with N—H, Si—N and Si—H bonds. Therefore, substantially all of the Si—N bonds in the original SOG layer were oxidized to form Si—O bonds during the wet oxidation curing process.

Wet Etch Rate Evaluation

EXPERIMENT 1

A SOG composition including polysilazane according to an exemplary embodiment of the invention was spin coated onto a bare test wafer to form a SOG layer of about 3,400 Å. This SOG layer was then hard-baked at about 400° C. for about 30 minutes, and then cured by immersion in an oxidant solution according to an exemplary embodiment of the invention for about ten minutes, thereby substantially converting the SOG layer into a silicon oxide layer. After measuring the thickness of the resulting silicon oxide layer, the test wafers were wet etched for 20 seconds in a 25° C. aqueous solution of buffered oxide etchant ($NH_4F+HF$ buffered solution). The thickness of the remaining silicon oxide layer was then measured and subtracted from the initial measurement to determine the amount removed. The amount removed during the etch was determined to be about 1570 Å.

EXPERIMENT 2

Test wafers having silicon oxide layers were prepared according to the procedure described above with regard to Experiment 1. The test wafers were then held under ambient conditions for one day after converting the SOG layer into the silicon oxide layer. After the hold period was completed, the test wafers were etched as described with regard to Experiment 1 and the amount removed during the etch was determined to be about 1530 Å.

EXPERIMENT 3

Test wafers having silicon oxide layers were prepared according to the procedure described above with regard to Experiment 1. The test wafers were then held under ambient conditions for two days after converting the SOG layer into the silicon oxide layer. After the hold period was completed, the test wafers were etched as described with regard to Experiment 1 and the amount removed during the etch was determined to be about 1520 Å.

EXPERIMENT 4

A SOG composition including polysilazane according to an exemplary embodiment of the invention was spin coated onto a bare test wafer to form a SOG layer of about 3,400 Å. This SOG layer was then hard-baked at about 400° C. for about 30 minutes, and then the test wafers were held under ambient conditions for a period of two days. After the hold period was completed, the SOG layers on the test wafers were cured by immersion in an oxidant solution according to an exemplary embodiment of the invention for about ten minutes, thereby substantially converting the SOG layer into a silicon oxide layer. After measuring the thickness of the resulting silicon oxide layer, the test wafers were held for an additional period of one day under ambient conditions. After the second hold period was completed, the test wafers were wet etched for 20 seconds in a 25° C. aqueous solution of buffered oxide etchant ($NH_4F+HF$ buffered solution). The thickness of the remaining silicon oxide layer was then measured and subtracted from the initial measurement to determine the amount removed during the etch. The amount removed during the etch was determined to be about 1590 Å.

COMPARATIVE EXPERIMENT 1

A SOG composition including polysilazane was spin coated onto a bare test wafer to form a SOG layer of about 3,400 Å. This SOG layer was then pre-baked at about 400° C. for about 30 minutes. After measuring the thickness of the hard-baked SOG layer, the test wafers were wet etched for 20 seconds in a 25° C. aqueous solution of buffered oxide etchant ($NH_4F+HF$ buffered solution). The thickness of the remaining SOG layer was then measured and subtracted from the initial measurement to determine the amount removed during the etch. The amount removed during the etch was determined to be about 2670 Å.

COMPARATIVE EXPERIMENT 2

Test wafers having SOG layers were prepared according to the procedure described above with regard to Comparative Experiment 1. The test wafers with their hard-baked SOG layers were then held under ambient conditions for one day. After the hold period was completed, the test wafers were etched as described in Comparative Experiment 1 and the amount removed during the etch was determined to be about 1290 Å.

As reflected in Experiments 1 to 4, when a SOG layer containing a polysilazane is treated with an oxidant solution according to an exemplary embodiment of the invention to form a silicon oxide layer, the resulting silicon oxide layer exhibits a substantially constant etch rate even if there is a substantial delay between the time of the SOG layer application and conversion or between conversion and etch. The exemplary embodiments of the invention thus make the silicon oxide layer cured in reduced time and provide a process for converting a SOG layer to a stable silicon oxide layer that may provide reduced variability with regard to subsequent etching processes when compared with conventional uncured SOG layers.

Although certain exemplary embodiments of the present invention have been described, it is understood that the present invention should not be limited to these embodiments but various changes and modifications can be made by one skilled in the art within the spirit and scope of the present invention as hereinafter claimed.

What is claimed is:

1. A method of forming a silicon oxide layer on a semiconductor substrate comprising:
   spin coating the semiconductor substrate with a SOG composition to form a SOG coating, the SOG composition including polysilazane dissolved in a first solvent;
   heating the SOG coating to a temperature of not more than about 400° C. for a soft bake time sufficient to evaporate substantially all of the first solvent from the SOG coating and thereby form a SOG layer; and
   treating the SOG layer with an oxidant solution selected from a group consisting of:
   an aqueous ozone solution, the concentration of ozone being between about 1 ppm and about 200 ppm, and an aqueous solution of hydrogen peroxide, the concentration of hydrogen peroxide being between about 0.5 weight percent and about 30 weight percent, to convert the polysilazane to silicon oxide.

2. A method of forming a silicon oxide layer according to claim 1, wherein the oxidant solution further comprises:
   at least one secondary oxidant selected from a group consisting of permanganates, hypochlorites, chlorites, chlorates, perchlorates, hypobromites, bromites, bromates, hypoiodites, iodites, iodates, nitric acid and sulfuric acid.

3. A method of forming a silicon oxide layer according to claim 1, wherein treating the SOG layer further comprises:
   applying the oxidant solution to the SOG layer by dipping, spraying or puddling, the oxidant solution including an oxidant dissolved in a second solvent.

4. A method of forming a silicon oxide layer according to claim 1, wherein the oxidant solution further comprises:
an aqueous ozone solution, the concentration of ozone being between about 5 ppm and about 100 ppm, the oxidant solution being applied to the SOG layer at a temperature of between about 20° C. and about 40° C.

5. A method of forming a silicon oxide layer according to claim 1, wherein forming the SOG layer further comprises:
further heating the SOG layer to a temperature between about 300° C. to about 500° C. under an oxidizing atmosphere for a time period between about 10 and about 120 minutes to form a partially converted SOG layer including silicon dioxide and polysilazane; and
treating the partially converted SOG layer with the oxidant solution to covert substantially all remaining polysilazane into silicon dioxide and thereby form the silicon dioxide layer.

6. A method of forming a silicon oxide layer according to claim 1, wherein the oxidant solution further comprises:
an aqueous solution of hydrogen peroxide, the oxidant solution being applied to the SOG layer at a temperature of between about 25° C. and about 90° C.

7. A method of forming a silicon oxide layer according to claim 6, wherein the oxidant solution further comprises:
an aqueous solution of ammonium hydroxide and hydrogen peroxide, the relative concentration of the ammonium hydroxide and hydrogen peroxide being sufficient to establish an ammonium hydroxide: hydrogen peroxide weight ratio between about 1:3 and 1:10.

8. A method of forming a silicon oxide layer according to claim 7, wherein the oxidant solution further comprises:
an aqueous solution of hydrogen peroxide and ammonium hydroxide, the concentration of hydrogen peroxide being between about 3 weight percent and about 10 weight percent and the concentration of the ammonium hydroxide being between about 0.5 weight percent and about 5 weight percent, the oxidant solution being applied to the SOG layer at a temperature of between about 40° C. and about 80° C.

9. A method of forming a silicon oxide layer according to claim 1, wherein:
the first solvent is an organic solvent;
and further wherein:
the SOG composition includes between about 5 weight percent and about 30 weight percent polysilazane.

10. A method of forming a silicon oxide layer according to claim 9, wherein:
the first solvent is selected from a group of organic solvents consisting of aromatic solvents, aliphatic solvents and ether-type solvents;
and further wherein:
the first solvent is between about 70 weight percent and about 95 weight percent of the SOG composition.

11. A method of forming a silicon oxide layer according to claim 10, wherein:
the first solvent includes at least one selected from the group consisting of toluene, benzene, xylene, dibutylether, diethylether, THF, PGME, PGMEA and hexane.

12. A method of forming a silicon oxide layer according to claim 1, wherein forming the SOG layer further comprises:
further heating the SOG layer to a temperature between about 300° C. and about 600° C. for a hard bake time sufficient to density the SOG layer.

13. A method of forming a silicon oxide layer according to claim 12, wherein forming the SOG layer further comprises:
further heating the SOG layer to a temperature between about 300° C. and about 600° C. for a hard bake time sufficient to increase a HF etch resistance of the SOG layer by at least 50%.

14. A method of forming a silicon oxide layer according to claim 12, further comprising:
annealing the silicon oxide layer at a temperature of at least 600° C. for an anneal time sufficient to form a densified silicon oxide layer.

15. A method of forming a silicon oxide layer according to claim 14, further comprising:
planarizing the densified silicon oxide layer.

16. A method of forming a silicon oxide layer according to claim 15, wherein planarizing the densified silicon oxide layer further comprises:
removing an upper portion of the densified silicon oxide layer using a dry etch, a wet etch or a chemical mechanical planarization (CMP).

17. A method of forming a silicon oxide layer according to claim 15, wherein planarizing the densified silicon oxide layer further comprises:
removing an upper portion of the densified silicon oxide layer to expose an upper surface of the semiconductor substrate.

18. A method of forming a silicon oxide layer according to claim 15, wherein planarizing the densified silicon oxide layer further comprises:
removing an upper portion of the densified silicon oxide layer to expose an upper surface of the semiconductor substrate using a CMP process; and
etching the silicon oxide layer to produce an oxide surface that is recessed relative to the upper surface of the semiconductor substrate.

19. A method of forming a silicon oxide layer according to claim 1, wherein:
the semiconductor substrate includes a pattern.

20. A method of forming a silicon oxide layer according to claim 19, wherein:
the pattern includes a conductive material.

21. A method of forming a silicon oxide layer according to claim 20, wherein:
the conductive material includes tungsten (W) or tungsten silicide ($WSi_x$).

22. A method of forming a silicon oxide layer according to claim 20, wherein:
the conductive material includes aluminum or copper.

23. A method of forming a silicon oxide layer according to claim 19, wherein:
the pattern includes recesses formed in the semiconductor substrate.

24. A method of forming a silicon oxide layer according to claim 23, wherein:
the pattern includes shallow trench isolation (STI) openings formed in the conductor substrate.

25. A method of manufacturing a semiconductor device comprising:
forming a SOG layer on a semiconductor substrate, the SOG layer including a polysilazane; and
treating the SOG layer with an oxidant solution selected from a group consisting of an aqueous ozone solution, the concentration of ozone being between about 1 ppm and about 200 ppm, and an aqueous hydrogen peroxide solution, the concentration of hydrogen peroxide being between about 0.5 weight percent and about 30 weight percent, to convert the polysilazane to silicon oxide.

26. A method of manufacturing a semiconductor device according to claim 25, further comprising:
forming isolation trench structures on the semiconductor substrate;
filling the isolation trench structures with the SOG layer; and
removing an upper portion of the silicon oxide to expose a surface of the semiconductor substrate.

27. A method of manufacturing a semiconductor device according to claim 25, further comprising:
forming gate electrode structures on the semiconductor substrate;
covering the gate electrode structures with the SOG layer;
forming openings in the silicon oxide to expose portions of the gate electrode structures; and
depositing a first metal layer on the silicon oxide.

28. A method of manufacturing a semiconductor device according to claim 25, further comprising:
forming a first conductive pattern on the semiconductor substrate;
covering the first conductive pattern with the SOG layer;
forming openings in the silicon oxide to expose portions of the first conductive pattern; and
depositing a second conductive layer on the silicon oxide.

29. A method of manufacturing a semiconductor device according to claim 25, further comprising:
forming a pattern on the semiconductor substrate, the pattern including recessed portions;
covering the pattern and filling the recessed portions with the SOG layer; and
removing an upper portion of the silicon oxide to expose a surface of the semiconductor substrate.

30. A method of manufacturing a semiconductor device according to claim 29, further comprising:
removing an additional portion of the silicon oxide to form an oxide surface in the recessed portion, the oxide surface being recessed relative to the surface of the semiconductor substrate.

31. A method of manufacturing a semiconductor device according to claim 30, wherein:
removing an upper portion of the silicon oxide is achieved using an etchback process or a CMP process; and
removing the additional portion of the silicon oxide is achieved an etchback process.

32. A method of manufacturing a semiconductor device comprising:
forming isolation trench structures on the semiconductor substrate;
filling the isolation trench structures with a first SOG layer, the first SOG layer including a polysilazane;
treating the first SOG layer with a first oxidant solution to form a first silicon oxide layer;
removing an upper portion of the first silicon oxide layer to expose a surface of the semiconductor substrate;
forming gate electrode structures on the surface of the semiconductor substrate;
covering the gate electrode structures with a second SOG layer, the second SOG layer including a polysilazane;
treating the second SOG layer with a second oxidant solution to form a second silicon oxide layer;
forming contact openings in the second silicon oxide layer to expose portions of the gate electrode structures;
forming a first conductive pattern on the second silicon oxide layer;
covering the first conductive pattern with a third SOG layer, the third SOG layer including a polysilazane;
treating the third SOG layer with a third oxidant solution to form a third silicon oxide layer;
forming via openings in the third silicon oxide layer to expose portions of the first conductive pattern; and
forming a second conductive pattern on the third silicon oxide layer.

33. A method of manufacturing a semiconductor device according to claim 32, wherein:
each of the oxidant solutions includes at least one oxidant selected from a group consisting of ozone, peroxides, permanganates, hypochlorites, chlorites, chlorates, perchlorates, hypobromites, bromites, bromates, hypoiodites, iodites, iodates, nitric acid and sulfuric acid.

34. A method of forming a silicon oxide layer on a semiconductor substrate comprising:
forming a spin-on-glass (SOG) layer on the semiconductor substrate, the SOG layer including polysilazane;
baking the spin-on-glass layer to convert a first portion of the polysilazane to silicon oxide while retaining an unconverted second portion of the polysilazane; and
treating the SOG layer with an oxidant solution selected from a group consisting of an aqueous ozone solution, the concentration of ozone being between about 1 ppm and about 200 ppm, and an aqueous hydrogen peroxide solution, the concentration of hydrogen peroxide being between about 0.5 weight percent and about 30 weight percent, to convert the second portion of the polysilazane to silicon oxide, thereby forming the silicon oxide layer.

35. A method of forming a silicon oxide layer according to claim 34, wherein the oxidant solution further comprises:
at least one secondary oxidant selected from the group consisting of permanganates, hypochlorites, chlorites, chlorates, perchlorates, hypobromites, bromites, bromates, hypoiodites, iodites, iodates, nitric acid and sulfuric acid.

36. A method of forming a silicon oxide layer according to claim 34, wherein treating the SOG layer further comprises:
applying the oxidant solution to the SOG layer by dipping, spraying or puddling, the oxidant solution including an oxidant dissolved in a second solvent.

37. A method of forming a silicon oxide layer according to claim 34, wherein forming the SOG layer further comprises:
spin coating the semiconductor substrate with a SOG composition to form a SOG coating, the SOG composition including polysilazane dissolved in a first solvent; and
heating the SOG coating to a temperature of not more than about 400° C. for a time sufficient to evaporate substantially all of the first solvent from the SOG coating and thereby form the SOG layer.

38. A method of forming a silicon oxide layer according to claim 37, wherein:
the first solvent is an organic solvent;
and further wherein:
the SOG composition includes between about 5 weight percent and about 30 weight percent polysilazane.

39. A method of forming a silicon oxide layer according to claim 38, wherein:

the first solvent includes at least one selected from the group consisting of toluene, benzene, xylene, dibutylether, diethylether, THF, PGME, PGMEA and hexane.

40. A method of forming a silicon oxide layer according to claim 37, wherein:
the baking the spin-on-glass layer is conducted in an oxidizing atmosphere.

41. A method of forming a silicon oxide layer according to claim 40, wherein:
the oxidizing atmosphere is an oxygen atmosphere or a water-vapor atmosphere.

42. A method of forming a silicon oxide layer according to claim 41, further comprising:
annealing the silicon oxide layer at a temperature of at least 600° C. for a time sufficient to form a densified silicon oxide layer.

43. A method of forming a silicon oxide layer according to claim 42, further comprising:
planarizing the silicon oxide layer.

44. A method of forming a silicon oxide layer according to claim 34, wherein:
the semiconductor substrate includes a pattern.

45. A method of forming a silicon oxide layer according to claim 44, wherein:
the pattern includes recesses formed in the semiconductor substrate.

46. A method of forming a silicon oxide layer according to claim 44, wherein:
the pattern includes a conductive material.

47. A method of forming a silicon oxide layer according to claim 46, wherein:
the conductive material includes tungsten (W) or tungsten silicide ($WSi_x$).

* * * * *